United States Patent [19]

Remy

[11] 4,186,356

[45] Jan. 29, 1980

[54] PHASE LOCKED LOOP FREQUENCY SYNTHESIZER AND FREQUENCY MODULATOR

[75] Inventor: Joël Rémy, Paris, France

[73] Assignee: Adret Electronique, Trappes, France

[21] Appl. No.: 897,602

[22] Filed: Apr. 18, 1978

[30] Foreign Application Priority Data

Apr. 20, 1977 [FR] France .................................. 77 12646
Jun. 17, 1977 [FR] France .................................. 77 19354

[51] Int. Cl.$^2$ ........................... H03B 3/04; H03C 3/02
[52] U.S. Cl. ......................................... 332/19; 331/2;
331/23; 331/25; 332/22; 332/23 R;
[58] Field of Search ............... 331/2, 39, 18, 25, 23
332/19;22;23 R

[56] References Cited

U.S. PATENT DOCUMENTS

| 3,319,178 | 5/1967 | Broadhead, Jr. | 331/2 |
| 3,480,883 | 11/1969 | Gaunt, Jr. | 332/19 |
| 3,838,355 | 9/1974 | Papaieck | 331/39 |

Primary Examiner—Siegfried H. Grimm
Attorney, Agent, or Firm—William Anthony Drucker

[57] ABSTRACT

Frequency-modulated electrical signal generator comprising two oscillators, the first delivering a modulated output frequency and driving a mixer which receives in addition the output of the second oscillator. The latter is phase-controlled by a loop comprising the mixer, a filter and a first phase comparator which receives an intermediate frequency. The first oscillator is controlled by a loop including the second oscillator followed by an adjustable frequency divider and a second comparator receiving a reference frequency.

6 Claims, 2 Drawing Figures

PHASE LOCKED LOOP FREQUENCY SYNTHESIZER AND FREQUENCY MODULATOR

BACKGROUND OF THE INVENTION

The present invention concerns frequency synthesizers of the type including at least two phase-control loops, driven by a reference frequency, delivers increments determined by the frequency to be synthesized and the other, driven by an intermediate frequency, delivers smaller frequency increments.

THE PRIOR ART

In circuits of this type already familiar, these two loops are physically independent of one another, one of them controlling the principal oscillator which delivers the frequency to be synthesized and the other controlling an auxiliary oscillator. The auxiliary loop generates large increments and includes a frequency divider, while the principal loop, which furnishes the small increments, does not include a frequency divider.

This results in various disadvantages which will be demonstrated below and of which the most important is that such arrangements are ill-suited to frequency modulation.

Now in certain applications it can be advantageous to have at one's disposal synthesizers which can be frequency-modulated and presenting in addition the high resolution associated with multiple-loop circuits.

OBJECTS AND SUMMARY OF THE INVENTION

The invention is intended to render possible such synthesizers without introducing any complication into the circuit.

It consists essentially of overlapping the two loops by driving the auxiliary oscillator from the output of the phase comparator which receives the intermediate frequency, and by driving the principal oscillator from the phase comparator which receives the reference frequency and the output of the frequency divider.

In certain applications, in particular to carry out measurements on telegraphy receivers, it is necessary to transmit the D.C. component of the modulation signal.

The invention further proposes to associate to the circuitry a circuit generating the intermediate frequency capable of supplying from a single oscillator, a variable increment of said frequency corresponding to one of the usual ranges of frequency excursion (in practice ±300 KHz, ±30 KHz and ±3 KHz).

The circuit generating the intermediate frequency according to the invention includes an oscillator controlled by a potential and means of applying the D.C. component of the frequency modulation to the control input of this oscillator in such a way as to vary the frequency of the oscillator by an increment corresponding to the maximum range of frequency excursion and is characterised by a plurality of increment dividers cascade-mounted to the oscillator output and each comprising a frequency divider and an auxiliary source of standard frequency driving a mixer, switches making it possible to take the output frequency from the circuit, either directly at the oscillator output or at the output of one of said mixers.

The auxiliary standard frequencies are selected so that the mixers return the intermediate frequency, so that only the increment is divided by the product of the division factors of one or more of the increment dividers which are used. The advantages arising from the invention are considerable and will appear clearly in the light of the description below.

DESCRIPTION OF THE PREFERRED EMBODIMENT

Figure 1:
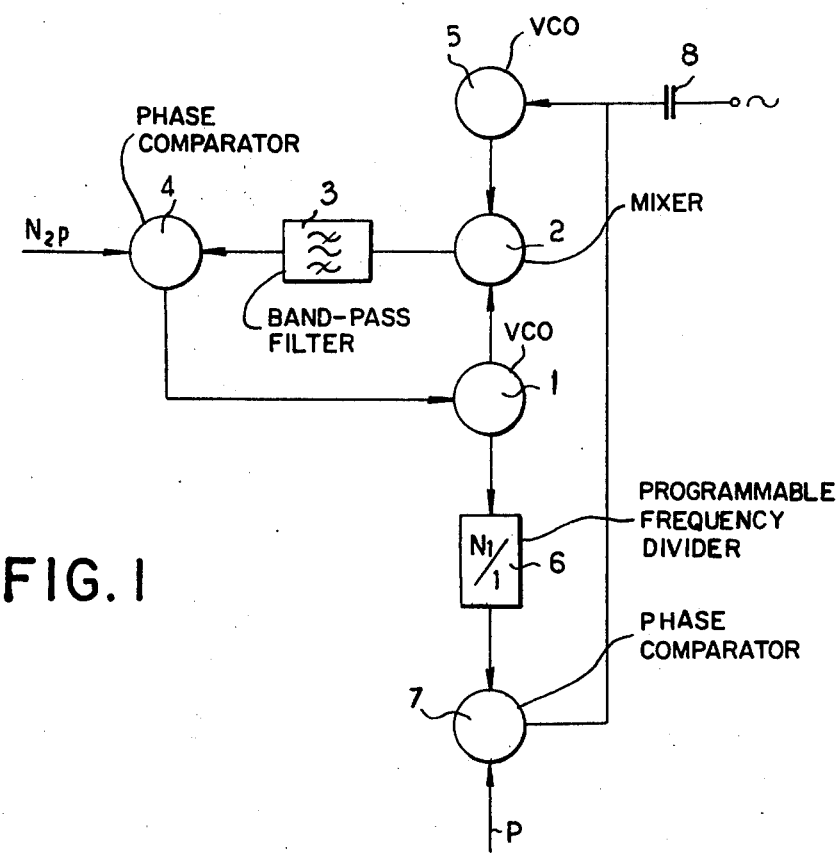
FIG. 1 is a skeleton diagram of a synthesizer capable of being frequency-modulated in accordance with the invention.

In FIG. 1, an auxiliary oscillator, of the type controlled by a potential, is phase-controlled by means of a loop including a mixer 2, a band-pass filter 3, and a phase comparator 4 which receives a reference frequency $N_2p$. The mixer 2 receives in addition the output frequency of the principal oscillator 5.

The latter, also of the type controlled by a potential, is phase-controlled by means of a loop including the mixer 2, the filter 3, the phase comparator 4, the oscillator 1, a frequency divider 6 of programmable ratio $N_1$ and a phase comparator 7 which receives in addition a reference frequency P. A modulation frequency f, in addition, is applied to the oscillator 5 through a capacitor 8.

Balance of the two overlapping loops is obtained when the frequencies at the two inputs of each of the two phase comparators 4 and 7 are equal, that is to say:

$$N_2p = O_5 \pm O_1 \text{ and}$$

$$O_1/N_1 = P,$$

$O_1$ and $O_5$ being the respective frequencies of the oscillators 1 and 5.

We have therefore, without taking the frequency modulation into account:

$$O_5 = \mp N_1 P + N_2 p$$

In other words, the oscillator 5 generates a mean frequency which is the algebraic sum of the reference frequency $N_2p$ and the reference frequency P, multiplied by $N_1$.

The term $N_2p$ is generated, either by an iterative frequency-synthesizing chain, for example of the type described in the French Pat. No. 1 430 462 dated Feb. 22, 1965 of General Radio Company, for "Frequency Synthesizing Apparatus," or by a simple oscillator phase-controlled by a loop comprising a programmable divider of ratio $N_2$ and a phase comparator receiving a reference frequency p.

The advantage of the circuit described will be appreciated if it is noted that the control loop of the principal oscillator 5, frequency-modulated, includes a variable ratio divider 6. This is not the case in the familiar circuit where the intermediate oscillator is driven by the output of the phase comparator which receives the reference frequency p, while the principal oscillator is driven by the output of the phase comparator which receives the intermediate frequency $N_2p$. In such a circuit, where the control loop of the output oscillator does not include a frequency divider, frequency modulation of this oscillator is in practice impossible or very difficult to obtain.

It is known that the control pass-band of a phase-controlled loop is inversely proportional to the ratio of the frequency divider which it includes. Since, in order that the modulation index should not be divided by the loop gain, the lowest modulation frequency must be greater than the cut-off frequency, the insertion of a divider permits as a result relatively low modulation frequencies (descending to the lower limit of audible frequencies, for example).

In addition, in order to avoid the accidental opening of the control loop, the phase excursion arising at the phase comparator during modulation must be limited. Now this phase excursion, thanks to the presence of the divider 6, is divided by $N_1$, which brings it within the range of acceptable values, even at low modulation frequencies.

The two conditions mentioned above (low cut-off frequency of the loop and phase excursion acceptable at the phase comparator) are clearly complied with only if $N_1$ is sufficiently large, having regard to the desired lower limit of the modulation frequency.

However, when $N_1$ reaches a value adequate to permit modulation in the desired range, it is possible that in order to obtain great frequency resolution it is necessary to increase $N_1$ still further.

Having regard to the fact that the residual noise of the phase comparator is multiplied by $N_1$, the output signal from the oscillator 1 will be affected by high noise. But the circuit of the invention does not necessitate an increase of $N_1$ beyond the value required to achieve modulation.

In other words the circuit does not present the same limitation as generator including a single oscillator and a single loop with frequency divider.

For such a generator of the former kind, this limitation means that a certain value of the ratio of division may not be exceeded and, as a result, one must be satisfied with an average resolution as soon as the generator has to work at high frequencies.

The circuit described possesses on the contrary a resolution as large as is desired, since the small frequency increments are furnished by the intermediate frequency, that is to say by a generating device which is not frequency-modulated and does not present any particular problem in construction.

In addition it is a well-known practice to combine two phase-controlled loops in order to generate small and large frequency increments respectively. In the known circuit, recalled above, these two loops are physically distinct from one another and the one which controls the principal oscillator does not include a frequency divider. Besides the fact already mentioned that such a circuit is ill-suited to frequency modulation, the result of this is that the output oscillator reproduces and adds the noise voltages which affect the auxiliary oscillator and the intermediate frequency. This is not the case in the circuit described, in which the noise that affects the auxiliary oscillator and the intermediate frequency is filtered out by the pass-band of the control loop of the principal oscillator. This circuit is therefore advantageous even when there is no question of frequency modulation.

It will be noted that the stability conditions of the two overlapping loops require that the one which includes the first phase comparator 4 should have a pass-band higher than that of the loop which includes the second phase comparator 7.

The capacitor 8 suppresses every direct current component which could be included in the modulation frequency; this is essential to the functioning of the control loop which controls the mean frequency of the oscillator 5.

In practice the filter 3 will be designed in such a way as to transmit the difference beat between the frequencies of the two oscillators, and one or other of these frequencies can be taken equally well as higher than the other.

It is clear that the circuit described can be utilised with phase modulation of the output oscillator.

Figure 2:
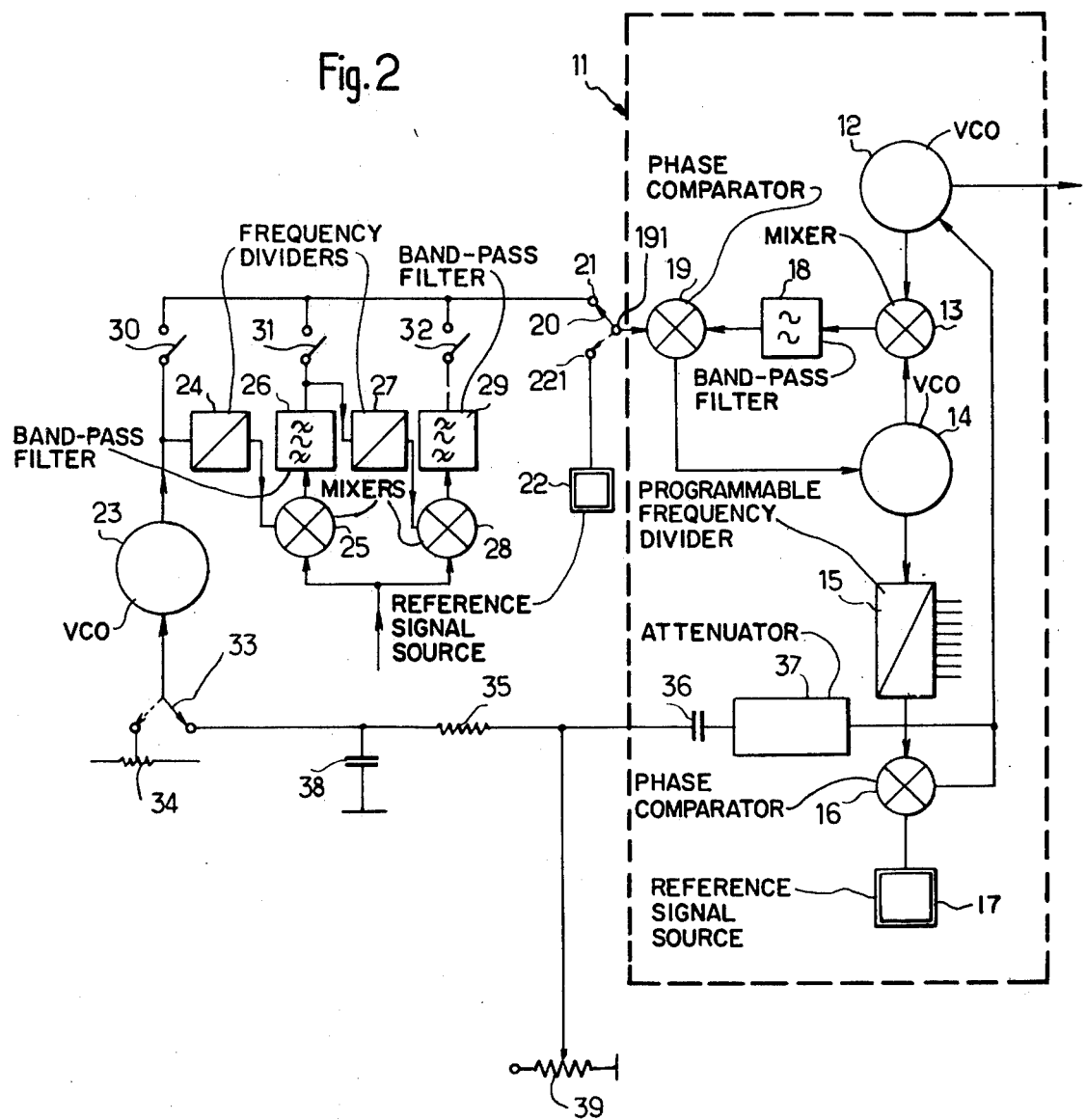
FIG. 2 shows a frequency-modulated synthesizer associated with a circuit generating the intermediate frequency in accordance with the invention.

FIG. 2 shows, inside a rectangle 11, a device for synthesizing a frequency lying between 20 and 30 MHz in steps of 1 KHz. This device is of the type shown in FIG. 1.

It includes an oscillator 12 frequency-controlled by by a potential covering the range 20 to 30 MHz, followed by a mixer 13. The latter is moreover driven by an oscillator 14 frequency-controlled by a potential, covering the range 16 to 20 MHz, itself followed by a programmable divider 15 whose division factor D may vary between 16,000 and 26,000. This divider drives a phase comparator 16, moreover driven by a standard frequency of 1 KHz supplied by a source 17. The output from phase comparator 16 controls the frequency of oscillator 12. The output from mixer 13, after passing through a pass-band filter 18 which only allows the subtractive beat between the frequencies of oscillators 12 and 14 to pass, i.e., 4 MHz$\pm\Sigma$, drives a phase comparator 19 which moreover receives, at its terminal 191, a frequency of 4 MHz$\pm\Delta$, $\Delta$ being an excursion which will be defined further on. The output from phase comparator 19 controls the frequency of oscillator 14.

Instead of the variable frequency 4 MHz$\pm\Delta$, terminal 191 may receive a standard frequency of 4 MHz. For this purpose, a change-over switch 20, instead of connecting terminal 191 to terminal 21 of the preceding circuit, connects terminal 191 to the output terminal 221 of a source 22.

The circuit which precedes circuit 11 comprises an oscillator 23 controlled by a potential whose frequency is variable in the range 4 MHz$\pm$0.3 MHz. It is followed by an increment divider made up as follows:

A first divider 24 of frequency by 10, connected to the output of oscillator 23, drives a mixer 25 which moreover receives a standard frequency of 3.6 MHz. The output from mixer 25, after filtering through a pass-band filter 26 which transmits the frequencies 4 MHz$\pm$30 KHz, drives a divider 27 by 10, itself followed by a mixer 28 which also receives the standard 3.6 MHz frequency. The output from mixer 28 is applied to a pass-band filter 29 which transmits the frequencies 4 MHz$\pm$3 KHz.

The outputs from oscillator 23 and filters 26 and 29 are connected in parallel to terminal 21 via switches 30, 31, 32 respectively. The control input of oscillator 23 is connected, by means of a switch 33, either to a potentiometer 34 supplied by a source of D.C. current (not shown) or to a circuit modulating the frequency of oscillator 12. This modulation circuit includes a potentiometer 39 which receives the modulation potential and which transmits the A.C. component to the control input of oscillator 12 via a capacitor 36 and an attenuator 37. The D.C. component of the modulation potential is applied to oscillator 23 via a filter consisting of a capacitor 38 and a resistor 35.

When change-over switch 33 is in the positions shown in dotted lines, potentiometer 34 makes it possible to vary the frequency of oscillator 23 in the range 4 MHz±100 KHz, so that the frequency applied to terminal 191 varies in the range 4 MHz±1 KHz (only switch 32 being closed).

When change-over switch 33 is in the positions shown in solid lines, the D.C. component of the modulation frequency has the effect of varying the output frequency of the circuit in one of the three ranges 4 MHz±300 KHz, 4 MHz±30 KHz, 4 MHz±3 KHz, as a function of the control of switches 30, 31 and 32.

In fact, when switch 30 is closed, while 31 and 32 are open, this obviously gives $\Delta = 300$ KHz. When only switch 31 is closed, the additive beat which occurs in mixer 25 reconstitutes the frequency of 4 MHz, but the excursion ±0.3 MHz is divided by 10; thus $\Delta = \pm 30$ KHz. Similarly, when only switch 32 is closed, the excursion is divided by 100; therefore $\Delta = \pm 3$ KHz.

The three values of the excursion thus obtained correspond to the three current values of the frequency excursion in frequency modulation.

To sum up, the circuit which has just been described makes it possible to transmit the D.C. component in frequency modulation and to effect the interpolation function with a 4 MHz oscillator which is variable in the range 4 MHz±300 KHz, thus easy to produce with good stability and satisfactory accuracy.

It goes without saying that various modifications may be made to the circuitry described and shown, without departing from the spirit of the invention.

I claim:

1. In a generator of variable frequency electrical signals comprising first and second oscillators, a frequency mixer having first and second inputs and an output, the first oscillator delivering an output frequency and feeding the first input of the frequency mixer, the second oscillator feeding the second input of the said frequency mixer and feeding also a frequency divider with programmable ratio, a first phase comparator having a first input connected to the output of the said frequency mixer and a second input receiving an intermediate frequency including a variable increment, a second phase comparator receiving the output of the frequency divider and a reference signal, the improvement that the output of the first comparator is connected to the second oscillator in order to control its frequency, and the output of the second comparator is connected to the first oscillator in order to control its frequency.

2. A generator of electrical signals, in accordance with claim 1, having means for applying a frequency modulation signal to the first oscillator.

3. A generator of electric signals, in accordance with claim 2, having a circuit, for generating the intermediate frequency, said circuit having a frequency output connected to the second input of the said first phase comparator, said circuit including a third voltage controlled oscillator and means for applying the D.C. component of the said frequency modulation signal to the control input of said third oscillator so as to cause the frequency of the third oscillator to vary by an increment corresponding to the maximum range of frequency excursion, and a plurality of increment dividers cascade-mounted to the output of the third oscillator and each comprising a frequency divider and an auxiliary source of standard frequency, a mixer having an output and first and second inputs respectively connected to the said frequency divider and to the said source of standard frequency, and switches making it possible to take the output frequency from the circuit, either directly from the third oscillator output or from the output of any one of said mixers.

4. A generator, in accordance with claim 3, wherein the mean frequency of the third oscillator is equal to 4 MHz, each of said frequency dividers having a dividing factor of 10 and the auxiliary standard frequency being equal to 3.6 MHz.

5. A generator, in accordance with claim 3, wherein said means for applying the D.C. component of the frequency modulation signal include a change-over switch one terminal of which is connected via a filter to the said frequency modulation signal and the other terminal of which is connected to an adjustable source of D.C. voltage, and wherein the connection between the third oscillator and said first phase comparator comprises a change-over switch one terminal of which is connected to the output of the third oscillator and the other terminal of which is connected to a source of standard frequency equal to the mean frequency of the third oscillator.

6. A generator, in accordance with claim 4, wherein said means for applying the D.C. component of the frequency modulation signal include a change-over switch one terminal of which is connected via a filter to the said frequency modulation signal and the other terminal of which is connected to an adjustable source of D.C. voltage, and wherein the connection between the third oscillator and said first phase comparator comprises a changeover switch one terminal of which is connected to the output of the third oscillator and the other terminal of which is connected to a source of standard frequency equal to the mean frequency of the third oscillator.

* * * * *